United States Patent
Park et al.

(10) Patent No.: US 10,699,847 B2
(45) Date of Patent: Jun. 30, 2020

(54) MULTILAYER CAPACITOR AND BOARD HAVING MULTILAYER CAPACITOR MOUNTED THEREON

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/621,114

(22) Filed: Jun. 13, 2017

(65) Prior Publication Data

US 2018/0144867 A1    May 24, 2018

(30) Foreign Application Priority Data

Nov. 23, 2016    (KR) .................. 10-2016-0156619

(51) Int. Cl.
  *H01G 2/06* (2006.01)
  *H01G 4/005* (2006.01)
  (Continued)

(52) U.S. Cl.
  CPC ............ *H01G 4/30* (2013.01); *H01G 2/06* (2013.01); *H01G 4/005* (2013.01); *H01G 4/012* (2013.01);
  (Continued)

(58) Field of Classification Search
  CPC .......... H01G 4/30; H01G 4/005; H01G 4/232; H01G 2/06; H10G 4/12
  (Continued)

(56) References Cited

U.S. PATENT DOCUMENTS

| 8,861,181 B2 * | 10/2014 | Lee | H01G 4/008 361/321.2 |
| 2013/0050897 A1 * | 2/2013 | Kim | H01G 4/12 361/321.2 |
| 2013/0058006 A1 * | 3/2013 | Kim | H01G 4/12 361/321.2 |
| 2013/0242457 A1 | 9/2013 | Lee et al. | |

(Continued)

FOREIGN PATENT DOCUMENTS

| JP | 2003-100552 A | 4/2003 |
| JP | 2006-100451 A | 4/2006 |

(Continued)

*Primary Examiner* — Arun Ramaswamy
(74) *Attorney, Agent, or Firm* — Morgan, Lewis & Bockius LLP

(57) ABSTRACT

A multilayer capacitor includes a capacitor body including a first surface and a second surface opposing each other, a third surface and a fourth surface connected to the first surface and the second surface and opposing each other, and a fifth surface and a sixth surface, a first internal electrode of the first internal electrodes being exposed through the third surface and the fourth surface, a second internal electrode of the second internal electrodes being exposed through the fifth surface and the sixth surface, a first external electrode and a second external electrode disposed in the third surface and the fourth surface of the capacitor body, respectively, the first external electrode and the second external electrode connected to an exposed portion of the first internal electrode, a third external electrode and a fourth external electrode disposed in the fifth surface and the sixth surface of the capacitor body, respectively.

11 Claims, 7 Drawing Sheets

(51) Int. Cl.
    *H01G 4/12*    (2006.01)
    *H01G 4/30*    (2006.01)
    *H01G 4/232*   (2006.01)
    *H05K 1/02*    (2006.01)
    *H01G 4/012*   (2006.01)
    *H05K 3/34*    (2006.01)

(52) U.S. Cl.
    CPC ............... *H01G 4/12* (2013.01); *H01G 4/232* (2013.01); *H05K 1/0231* (2013.01); *H05K 3/3442* (2013.01); *H05K 2201/10015* (2013.01); *H05K 2201/10636* (2013.01)

(58) Field of Classification Search
    USPC ............ 361/306.1, 301.4, 321.1, 303, 306.3, 361/321.2, 321.3
    See application file for complete search history.

(56) References Cited

U.S. PATENT DOCUMENTS

| 2013/0250476 | A1* | 9/2013 | Chung | H01G 4/30 361/303 |
| 2015/0021082 | A1 | 1/2015 | Park et al. | |
| 2015/0041193 | A1* | 2/2015 | Lee | H01G 4/12 174/258 |
| 2015/0325372 | A1* | 11/2015 | Lee | H01G 4/30 174/260 |

FOREIGN PATENT DOCUMENTS

| JP | 2015-076591 A | 4/2015 |
| KR | 10-2013-0104360 A | 9/2013 |
| KR | 10-2016-0106026 A | 9/2016 |

* cited by examiner

US 10,699,847 B2

MULTILAYER CAPACITOR AND BOARD HAVING MULTILAYER CAPACITOR MOUNTED THEREON

CROSS-REFERENCE TO RELATED APPLICATION

This application claims the benefit of priority to Korean Patent Application No. 10-2016-0156619, filed on Nov. 23, 2016 with the Korean Intellectual Property Office, the entirety of which is incorporated herein by reference.

TECHNICAL FIELD

The present disclosure relates to a multilayer capacitor and a board having the same mounted thereon.

BACKGROUND

A large scale integrated circuit (LSI) is a component representing, or functioning as, an application processor of a smartphone.

Recently, in an LSI, as a driving voltage is lowered due to a decrease in power and an allowable power supply voltage for securing an operation of a system is decreased, the stability of a system with respect to power supply noise is reduced.

In addition, as a processing speed of LSI increases and functions are increased, an operating frequency increases and a sudden transient current may be generated in a power supply circuit. Thus, a frequency at which a voltage fluctuates increases and high frequency of a power supply noise increases, and a stability of a system may be reduced.

Therefore, in order to improve system stability of a high-performance LSI by reducing a change in a voltage and a power supply noise, it is advantageous to design power impedance to be low in a wide frequency band.

Power impedance is influenced by a design of a board and a decoupling capacitor. In detail, performance of the decoupling capacitor significantly affects power impedance.

In other words, in order to reduce power impedance, it has been necessary to lower equivalent series inductance (ESL) of the decoupling capacitor by as much as possible.

SUMMARY

An aspect of the present disclosure provides a multilayer capacitor capable of reducing ESL, and a board having the same mounted thereon.

According to an aspect of the present disclosure, a multilayer capacitor includes a capacitor body including dielectric layers and a plurality of first internal electrodes and second internal electrodes alternately disposed with respective dielectric layers interposed therebetween, the capacitor body further having a first surface and a second surface opposing each other, a third surface and a fourth surface connected to the first surface and the second surface and opposing each other, and a fifth surface and a sixth surface connected to the first surface, second surface, third surface and the fourth surface, the fifth and sixth surfaces opposing each other, a first internal electrode of the first internal electrodes being exposed through the third surface and the fourth surface, a second internal electrode of the second internal electrodes being exposed through the fifth surface and the sixth surface, a first external electrode and a second external electrode disposed in the third surface and the fourth surface of the capacitor body, respectively, the first external electrode and the second external electrode connected to an exposed portion of the first internal electrode, a third external electrode and a fourth external electrode disposed in the fifth surface and the sixth surface of the capacitor body, respectively, the third external electrode and the fourth external electrode connected to an exposed portion of the second internal electrode, an insulating layer disposed between each of the first external electrode and the third external electrode, the first external electrode and the fourth external electrode, the second external electrode and the third external electrode and the second external electrode and the fourth external electrode, and a first conductive resin layer, a second conductive resin layer, a third conductive resin layer and a fourth conductive resin layer formed on the first external electrode, the second external electrode, the third external electrode and the fourth external electrode, respectively.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
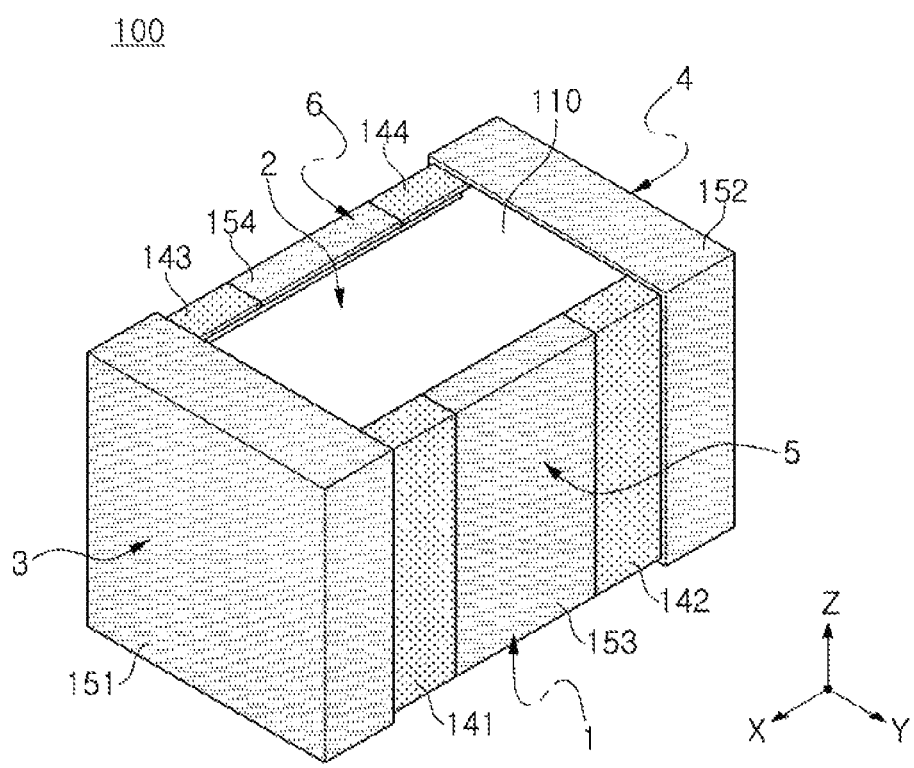
FIG. 1 is a perspective view illustrating a multilayer capacitor according to exemplary embodiments of the present disclosure.

Hereinafter, exemplary embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, exemplary embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular exemplary shapes of regions shown herein, for example, to include a change in shape results in manufacturing. The following embodiments may also be constituted alone, in combination or in partial combination.

The contents of the present disclosure described below may have a variety of configurations and propose only an exemplary configuration herein, but are not limited thereto.

When a direction of a capacitor body is defined to clearly illustrate exemplary embodiments of the present disclosure, X, Y, and Z, denoted on the drawings, represent a longitudinal direction, a width direction, and a thickness direction, respectively. Here, the thickness direction may be used in the same concept as a direction in which a dielectric layer and an internal electrode are stacked.

In addition, in an exemplary embodiment, for convenience of explanation, both surfaces opposing in a Z-direction of a capacitor body 110 are designated as a first surface 1 and a second surface 2, both surfaces opposing in an X-direction and connecting the first surface 1 and the second surface 2 are designated as a third surface 3 and a fourth surface 4, and both surfaces opposing in a Y-direction and connecting the first surface 1 and the second surface 2 as well as the third surface 3 and the fourth surface 4 are designated as a fifth surface 5 and a sixth surface 6, which will be described together. Here, the first surface 1 may be used as having the same concept as a mounting surface.

Multilayer Capacitor

Figure 2A:
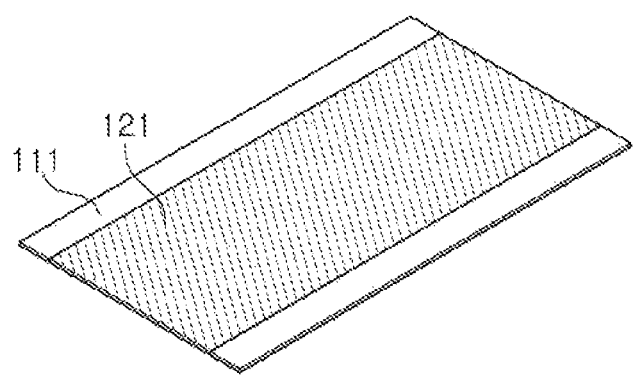
FIGS. 2A and 2B are perspective views illustrating a first internal electrode and a second internal electrode in a multilayer capacitor according to exemplary embodiments of the present disclosure.
Figure 2B:
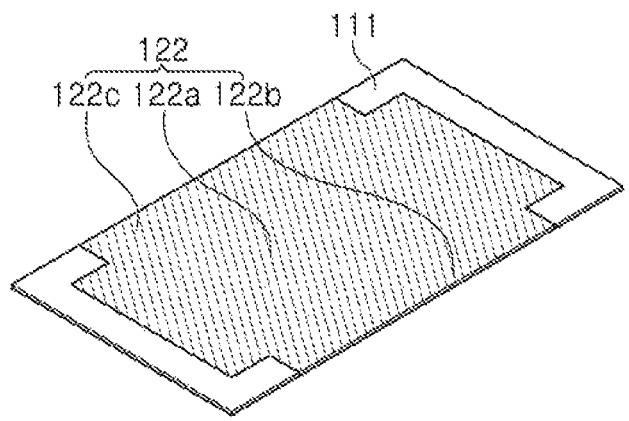
Figure 3:
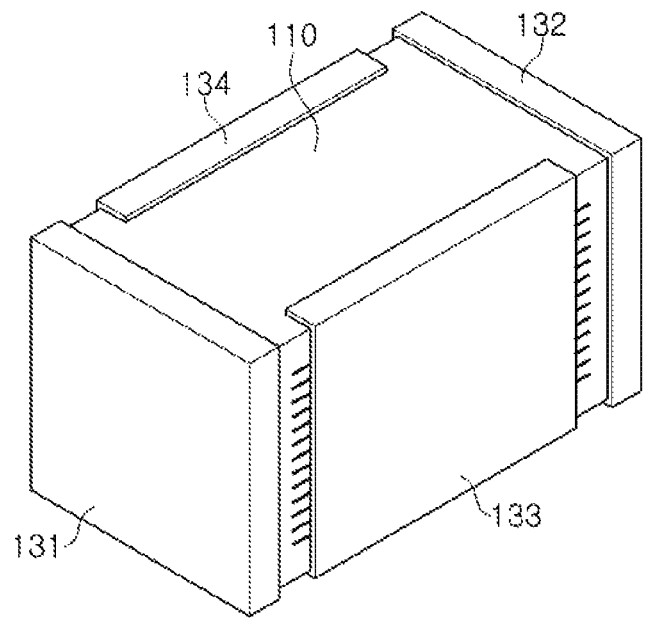
FIG. 3 is a perspective view illustrating a multilayer capacitor according to exemplary embodiments of the present disclosure in which a first external electrode to a fourth external electrode are formed in a capacitor body.
Figure 4:
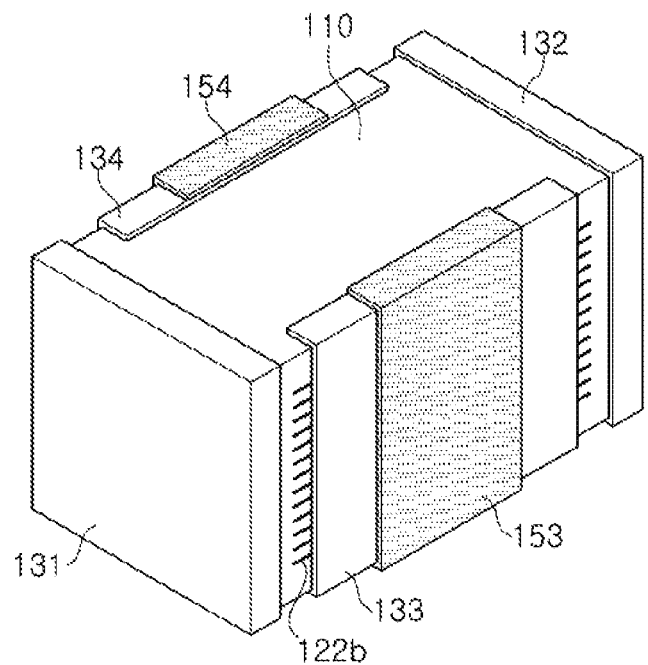
FIG. 4 is a perspective view in which a third conductive resin layer and a fourth conductive resin layer are further formed in the multilayer capacitor of FIG. 3.
Figure 5:
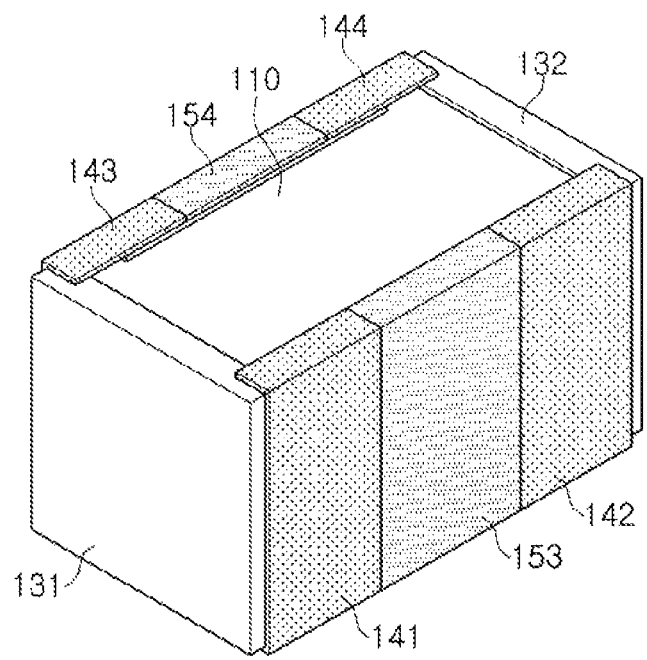
FIG. 5 is a perspective view in which a first insulating layer and a fourth insulating layer are further formed on the multilayer capacitor of FIG. 4.

FIG. 1 is a perspective view illustrating a multilayer capacitor according to exemplary embodiments of the present disclosure. FIGS. 2A and 2B are perspective views illustrating a first internal electrode and a second internal electrode in a multilayer capacitor according to exemplary embodiments of the present disclosure. FIG. 3 is a perspective view illustrating a multilayer capacitor according to exemplary embodiments of the present disclosure in which a first external electrode to a fourth external electrode are formed in a capacitor body. FIG. 4 is a perspective view in which a third conductive resin layer and a fourth conductive resin layer are further formed in the multilayer capacitor of FIG. 3. FIG. 5 is a perspective view in which a first insulating layer and a fourth insulating layer are further formed on the multilayer capacitor of FIG. 4.

With reference to FIGS. 1 to 5, a multilayer capacitor 100 according to exemplary embodiments of the present disclosure may include a capacitor body 110 including a dielectric layer 111 and a plurality of first internal electrodes 121 and second internal electrodes 122, a first external electrode 131, a second external electrode 132, a third external electrode 133 and a fourth external electrode 134, a first insulating layer 141, a second insulating layer 142, a third insulating layer 143 and a fourth insulating layer 144, and a first conductive resin layer 151, a second conductive resign layer 152, a third conductive resin layer and a fourth conductive resin layer 154.

The capacitor body 110 is formed by stacking a plurality of dielectric layers 111, and may have an approximately hexahedral shape as illustrated, but the shape is not limited thereto.

In this case, a shape of the capacitor body 110, dimensions thereof, and the stacking number of the dielectric layer 111, are not limited to those illustrated in the drawings.

In addition, the dielectric layer 111 is in a sintered state, and boundaries between the dielectric layers 111 adjacent each other may be integrated, so that the boundaries may be difficult to be seen without using a scanning electron microscope (SEM).

The capacitor body 110 may include an active region including a first internal electrode 121 and a second internal electrode 122, as a portion contributing to capacitance formation of a capacitor, and cover regions disposed on upper and lower sides of the active region in a Z-direction, as margin portions.

The active region may be formed by repeatedly stacking a plurality of first internal electrodes 121 and second internal electrodes 122 with the dielectric layers 111 interposed therebetween.

In this case, a thickness of the dielectric layer 111 may be altered according to a capacitance design of the multilayer capacitor 100.

In addition, the dielectric layer 111 may include ceramic powder with a high dielectric constant, for example, a barium titanate ($BaTiO_3$)-based or strontium titanate ($SrTiO_3$)-based powder, but the disclosure is not limited thereto.

In addition, in the dielectric layer 111, with the ceramic powder, when necessary, at least one or more of a ceramic additive, an organic solvent, a plasticizer, a binder, a dispersant, and the like may further be added thereto.

The cover regions may have the same material and configuration as the dielectric layer 111, except that the cover regions are disposed in upper and lower portions of the capacitor body 110 in a Z-direction, respectively, and do not include an internal electrode.

The cover regions may be prepared by stacking a single dielectric layer 111, or two or more dielectric layers 111 on a vertically outermost portion of the active region in a Z-direction, and may serve to prevent damage to the first internal electrode 121 and the second internal electrode 122 caused by physical or chemical stress.

The first internal electrode 121 and the second internal electrode 122 are electrodes having different polarities.

The first internal electrode 121 and the second internal electrode 122 are alternately disposed in a Z-direction with the dielectric layer 111 interposed therebetween inside the capacitor body 110, and an area in which the first internal electrode 121 and the second internal electrode 122 overlap each other in a Z-direction may be related to capacitance formation of a capacitor.

In addition, the first internal electrode 121 and the second internal electrode 122 may be formed by printing conductive paste containing a conductive metal with a predetermined thickness on the dielectric layer 111, and may be electrically insulated from each other by the dielectric layer 111 interposed therebetween.

The conductive metal contained in the conductive paste may be, for example, nickel (Ni), copper (Cu), palladium (Pd) or alloys thereof, but exemplary embodiments are not limited thereto.

In addition, a printing method of the conductive paste may be a screen printing method, a gavure printing method, or the like, but exemplary embodiments are not limited thereto.

Both ends of the first internal electrode 121 in an X-direction may be formed to be exposed through a third surface 3 and a fourth surface 4 of the capacitor body 110.

Both ends of the second internal electrode 122 in a Y-direction may be formed to be exposed through a fifth surface 5 and a sixth surface 6 of the capacitor body 110.

In this case, the second internal electrode 122 may include a body portion 122a disposed to be spaced apart from an edge of the capacitor body and vertically overlapping a portion of the first internal electrode 121 as well as a first lead portion 122b and a second lead portion 122c extended from the body portion 122a to be exposed through the fifth surface 5 and the sixth surface 6 of the capacitor body.

Here, the body portion 122a may have margin portions to the right and left on both ends in an X-direction, thereby improving an effect of preventing cracking and delamination, which may otherwise occur in corners of the capacitor body 110.

The first external electrode 131 and the second external electrode 132 are disposed in the third surface 3 and the fourth surface 4 of the capacitor body 110, respectively, and are connected to both ends of the first internal electrode 121, exposed through the third surface 3 and the fourth surface 4 of the capacitor body 110, respectively.

In this case, the first external electrode 131 and the second external electrode 132 may be formed to be extended from the third surface 3 and the fourth surface 4 of the capacitor body 110 to portions of the first surface 1 and the second surface 2 and portions of the fifth surface 5 and the sixth surface 6.

A third external electrode 133 and a fourth external electrode 134 are disposed in the fifth surface 5 and the sixth surface 6 of the capacitor body 110, respectively, and are connected to ends of the first lead portion 122b and the second lead portion 122c of the second internal electrode 122, exposed through the fifth surface 5 and the sixth surface 6 of the capacitor body 110, respectively.

In addition, the third external electrode 133 and the fourth external electrode 134 may be formed to be extended from the fifth surface 5 and the sixth surface 6 of the capacitor body 110 to portions of the first surface 1 and the second surface 2.

In this case, lengths of the first lead portion 122b and the second lead portion 122c of the second internal electrode 122 in an X-direction may be formed to be longer than lengths of the third external electrode 133 and the fourth external electrode 134 in an X-direction. Here, portions of both ends of the first lead portion 122b and the second lead portion 122c may not be covered by the third external electrode 133 and the fourth external electrode 134 but may be exposed externally.

The first, second, third and fourth external electrodes 131, 132, 133, 134 may be formed of conductive metal and conductive paste containing glass.

The first, second, third and fourth conductive resin layers 151, 152, 153, 154 may be formed in the first, second, third and fourth external electrodes 131, 132, 133, 134, respectively.

In this case, the first, second, third and fourth conductive resin layers 151, 152, 153, 154 may be formed to cover respective portions of the first, second, third and fourth external electrodes 131, 132, 133, 134. In other words, areas of the first, second, third and fourth conductive resin layers 151, 152, 153, 154 may be formed to be smaller than areas of the first, second, third and fourth external electrodes 131, 132, 133, 134, respectively.

In addition, the first conductive resin layer 151 may be formed to cover portions of the first insulating layer 141 and the third insulating layer 143 which will be described later, and the second conductive resin layer 152 may be formed to cover portions of the second insulating layer 142 and the fourth insulating layer 144 which will be described later.

The first insulating layer 141 is formed between the first external electrode 131 and the third external electrode 133 in the fifth surface 5 of the capacitor body 110. In this case, the first insulating layer 141 may be formed to be extended to portions of the first surface 1 and the second surface 2 of the capacitor body 110.

In addition, when the third conductive resin layer 153 covers only a portion of the third external electrode 133 and one portion of the third external electrode 133 in an X-direction is exposed, the first insulating layer may be formed to cover an exposed portion of the third external electrode 133.

The second insulating layer 142 is formed between the second external electrode 132 and the third external electrode 133 in the fifth surface 5 of the capacitor body 110. In this case, the second insulating layer 142 may be formed to be extended to portions of the first surface 1 and the second surface 2 of the capacitor body 110.

In addition, when the third conductive resin layer 153 covers only a portion of the third external electrode 133 and the other portion of the third external electrode in an X-direction is exposed, the second insulating layer may be formed to cover an exposed portion of the third external electrode 133.

The third insulating layer 143 is formed between the first external electrode 131 and the fourth external electrode 134 in the sixth surface 6 of the capacitor body 110. In this case, the third insulating layer 143 may be formed to be extended to portions of the first surface 1 and the second surface 2 of the capacitor body 110.

In addition, when the fourth conductive resin layer 154 covers only a portion of the fourth external electrode 134 and one portion of the fourth external electrode in an X-direction is exposed, the third insulating layer may be formed to cover an exposed portion of the fourth external electrode 134.

The fourth insulating layer 144 is formed between the second external electrode 132 and the fourth external electrode 134 in the sixth surface 6 of the capacitor body 110. In this case, the fourth insulating layer 144 may be formed to be extended to portions of the first surface 1 and the second surface 2 of the capacitor body 110.

In addition, when the fourth conductive resin layer 154 covers only a portion of the fourth external electrode 134 and the other portion of the fourth external electrode 134 in an X-direction is exposed, the fourth insulating layer may be formed to cover an exposed portion of the fourth external electrode 134.

In this case, the first insulating layer 141 to the fourth insulating layer 144 may be formed of at least one material selected from a curable resin such as an epoxy, an insulating ceramic, an insulating resin, or a filler, but exemplary embodiments are not limited thereto.

The first insulating layer 141 to the fourth insulating layer 144 serve to cover a portion of an internal electrode, not covered by an external electrode but exposed externally, so as to be insulated.

Thus, even when a portion of the second internal electrode 122, increased as lengths of the first lead portion 122b and the second lead portion 122c in an X-direction are increased, is not covered by the third external electrode 133 and the fourth external electrode 134, a decrease in insulation resistance caused by penetration of moisture may not occur.

In addition, the first, second, third and fourth insulating layers 141, 142, 143, 144 increase durability of the capacitor body 110 and further secure a margin at a predetermined thickness, and thus may serve to improve reliability of a capacitor.

Meanwhile, after the capacitor body 110 is formed, the first, second, third and fourth insulating layers 141, 142, 143, 144 are formed thereabove. Thus, when thicknesses thereof are significantly reduced as long as insulating properties, durability of the capacitor body 110, and reliability of a capacitor are maintained at a certain level, a size of a product may be significantly reduced.

Figure 6:
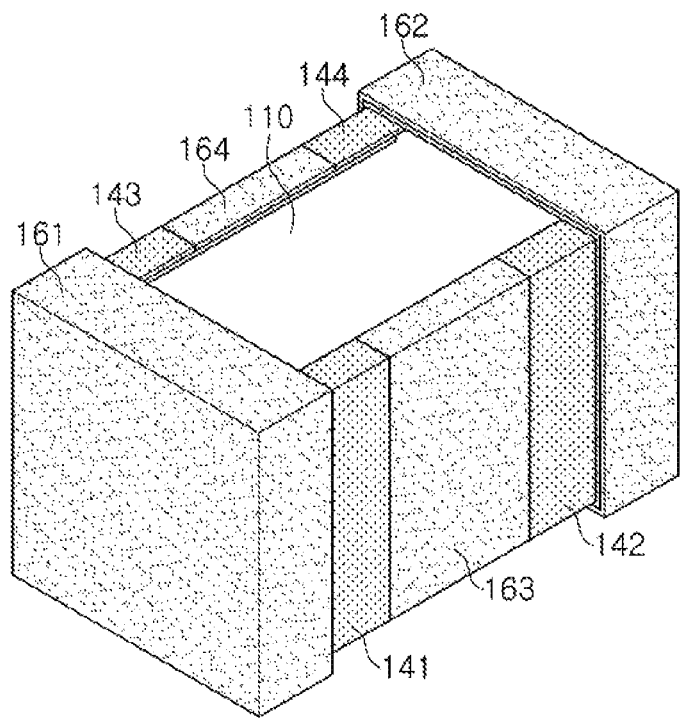
FIG. 6 is a perspective view illustrating a plating layer formed on the multilayer capacitor of FIG. 5.

Meanwhile, as illustrated in FIG. 6, first, second, third and fourth plating layers 161, 162, 163, 164 may be formed in the first, second, third and fourth conductive resin layers 151, 152, 153, 154, respectively.

In this case, the first, second, third and fourth plating layers 161, 162, 163, 164 may have a structure in which a nickel (Ni) plating layer and a tin (Sn) plating layer are sequentially stacked.

Figure 7:
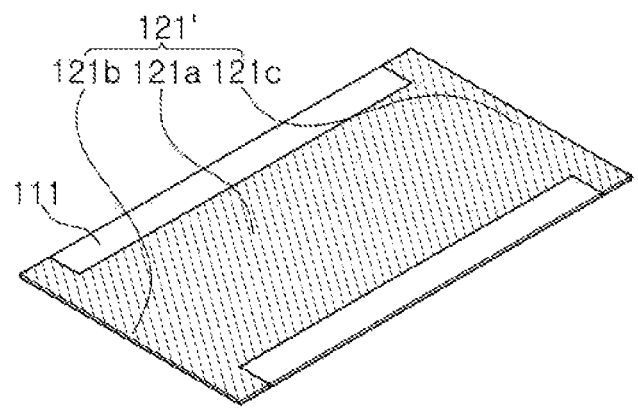
FIG. 7 is a perspective view illustrating a first internal electrode in a multilayer capacitor according to exemplary embodiments of the present disclosure.
Figure 8:
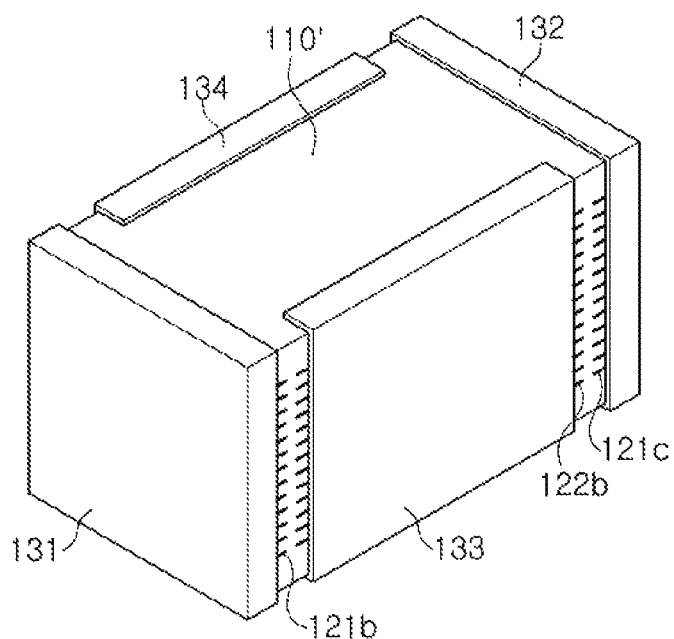
FIG. 8 is a perspective view illustrating a first external electrode to a fourth external electrode are formed in a capacitor body in a multilayer capacitor to which the first internal electrode of FIG. 7 is applied.

FIG. 7 is a perspective view illustrating a first internal electrode in a multilayer capacitor according to exemplary embodiments of the present disclosure, and FIG. 8 is a perspective view illustrating a first external electrode to a fourth external electrode are formed in a capacitor body in a multilayer capacitor to which the first internal electrode of FIG. 7 is applied.

Here, a dielectric layer 111, a second internal electrode 122, a first, second, third and fourth external electrode 131, 132, 133, 134, a first, second, third and fourth insulating layer 141, 142, 143, 144, and a first, second, third and fourth conductive resin layer 151, 152, 153, 154 are similar to those according to the exemplary embodiment described previously, so a detailed description will be omitted in order to avoid redundancy.

With reference to FIGS. 7 and 8, a first internal electrode 121' may include a body portion 121a overlapping a body portion 122a of a second internal electrode 122 as well as a third lead portion 121b and a fourth lead portion 121c formed to be extended from the body portion 121a in both ends in an X-direction.

The third lead portion 121b may be exposed through a third surface 3 of a capacitor body 110' and portions of a fifth surface 5 and a sixth surface 6, and the fourth lead portion 121c may be exposed through a fourth surface 4 of the capacitor body 110' and portions of the fifth surface 5 and the sixth surface 6.

In this case, a portion of the third lead portion 121b, exposed through the fifth surface 5 and the sixth surface 6, may not be covered by the first external electrode 131 but may be exposed externally.

In addition, a portion of the fourth lead portion 121c exposed through the fifth surface 5 and the sixth surface 6, may not be covered by the second external electrode 132 but may be exposed externally.

Board Having Multilayer Capacitor Mounted Thereon

Figure 9:
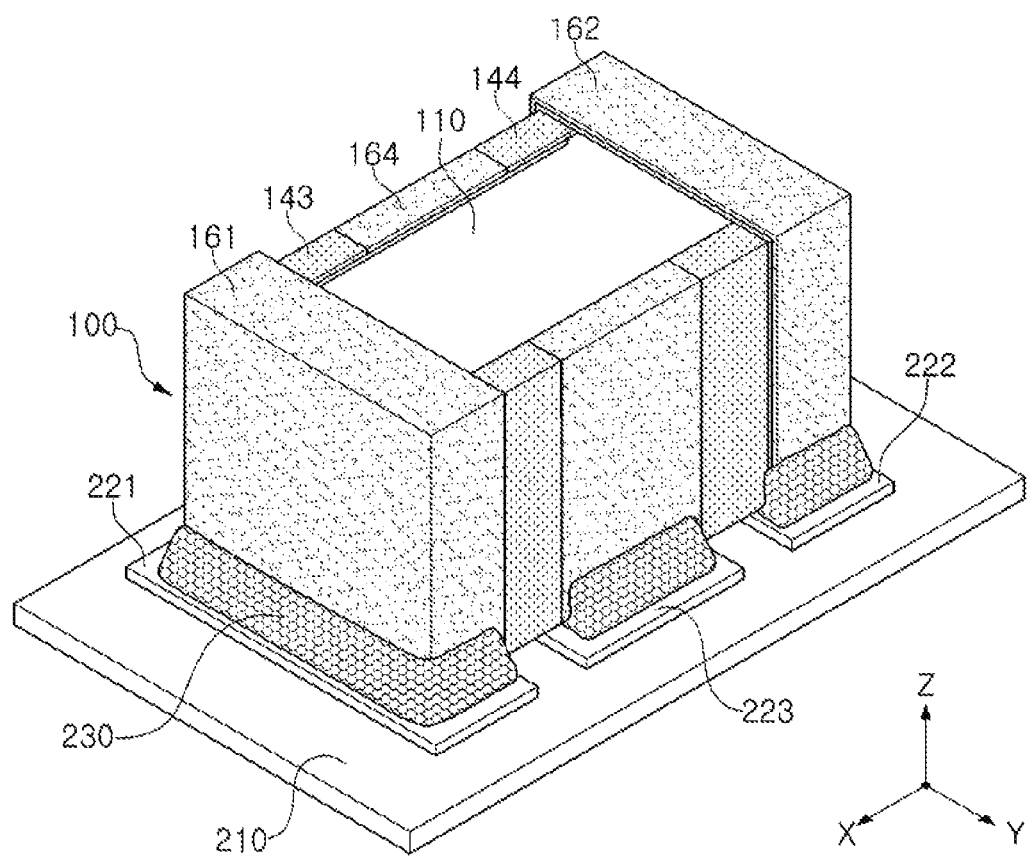
FIG. 9 is a perspective view illustrating the multilayer capacitor of FIG. 1 mounted on a substrate.
Figure 10:
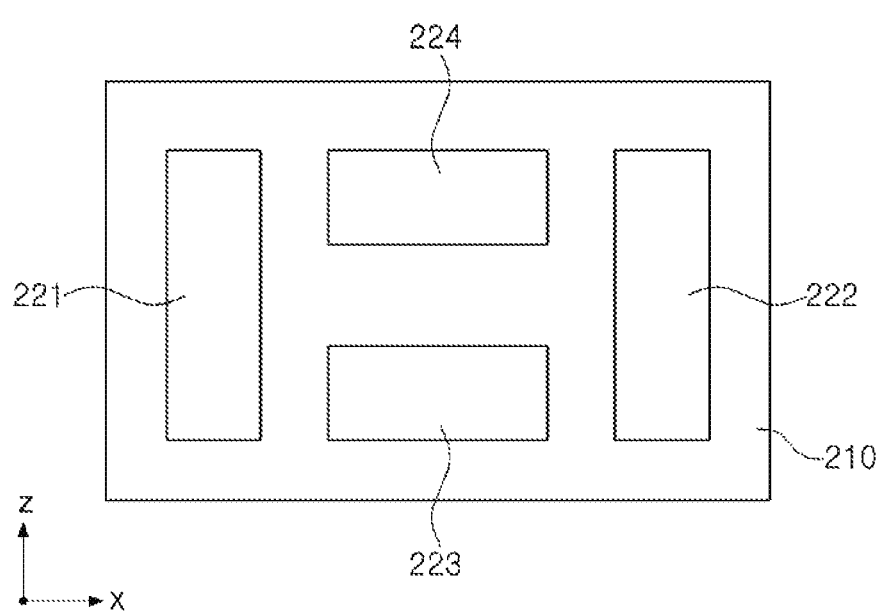
FIG. 10 is a plan view of the substrate of FIG. 9.

With reference to FIGS. 9 and 10, a board having a multilayer capacitor mounted thereon according to exemplary embodiments may include a substrate 210 on which a multilayer capacitor 100 is mounted, a first electrode pad 221 and a second electrode pad 222 spaced apart from each other in an X-direction on an upper surface of the substrate 210, and a third electrode pad 223 and a fourth electrode pad 224 spaced apart from each other in a Y-direction thereon.

As a first external electrode and a second external electrode are fixed by a solder 230, while disposed to be in contact with the first electrode pad 221 and the second electrode pad 222, and a third external electrode and a fourth external electrode are fixed by the solder 230, while disposed to be in contact with the third electrode pad 223 and the fourth electrode pad 224, the multilayer capacitor 100 may be electrically connected to the substrate 210. A first, second, third and fourth plating layer 161, 162, 163, 164 are formed on the first, second, third and fourth external electrode 131, 132, 133, 134, respectively.

Figure 11:
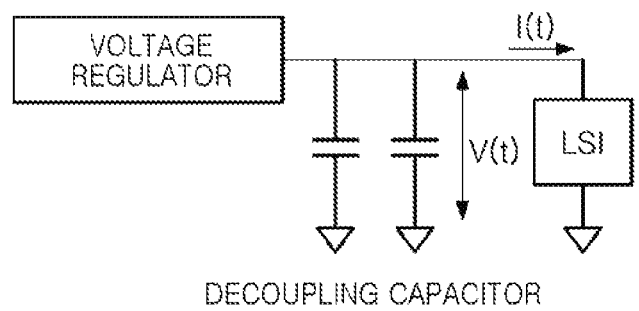
FIG. 11 is a circuit diagram schematically illustrating a multilayer capacitor according to exemplary embodiments of the present disclosure used as a decoupling capacitor of a power circuit of a large scale integrated circuit (LSI)
Figure 12:
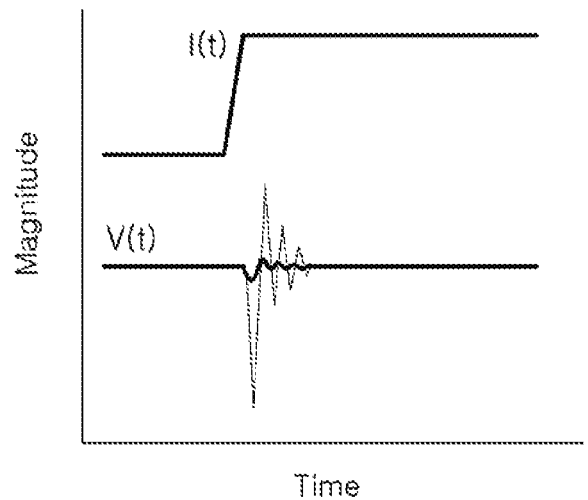
FIG. 12 is a graph illustrating a change in current and a variation of voltage in the circuit of FIG. 11.

FIG. 11 is a circuit diagram schematically illustrating exemplary embodiments of the present disclosure in which a multilayer capacitor according to the present disclosure is used as a decoupling capacitor of an LSI power circuit, and FIG. 12 is a graph illustrating a change in current I (t) and a variation of voltage V (t) in the circuit of FIG. 11.

With reference to FIGS. 11 and 12, a plurality of decoupling capacitors disposed between a voltage regulator and LSI absorb a change in sudden and large current flowing in LSI and a variation of voltage occurring by wiring inductance, and thus may serve to stabilize a power supply voltage. In this case, between respective capacitors, antiresonance may be induced and impedance may increase.

When a multilayer capacitor according to exemplary embodiments of the present disclosure is applied as a decoupling capacitor used in an LSI power circuit, a length of a portion of a second internal electrode, exposed outside a capacitor body, is increased, so ESL may be allowed to be significantly reduced.

Thus, a change in current and a variation of voltage occurring by wiring inductance are absorbed well, so power impedance may be significantly reduced. In this case, system stability to a power noise of LSI may be significantly improved.

In addition, when a capacitor is mounted on a board, the arrangement and size of an external terminal are substantially the same as a capacitor according to the related art, so the capacitor may be mounted on the same land pattern as a capacitor according to the related art. Here, the capacitor may be easily applied to a circuit structure according to the related art.

As set forth above, according to exemplary embodiments of the present disclosure, ESL of a multilayer capacitor may be reduced.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a capacitor body including dielectric layers and first internal electrodes and second internal electrodes alternately disposed with respective dielectric layers interposed therebetween;
a first external electrode disposed on one surface of the capacitor body, connected to portions of the first internal electrodes exposed from the one surface, and extending onto another surface of the capacitor body;
a first insulating layer disposed on the another surface of the capacitor body, and extending onto an extending portion of the first external electrode on the another surface; and
a first conductive resin layer covering the first external electrode on the one surface, and extending onto the another surface to cover a portion of the first insulating layer which extends onto the extending portion of the first external electrode,
wherein the portion of the first insulating layer is disposed between the extending portion of the first external electrode and an extending portion of the first conductive resin layer on the another surface, and
another portion of the first insulating layer on the another surface is exposed from the first conductive resin layer.

2. The multilayer capacitor of claim 1, wherein the capacitor body has a first surface and a second surface opposing each other in a thickness direction of the capacitor body along which the dielectric layers are stacked, a third surface and a fourth surface connected to the first surface and the second surface and opposing each other in a length direction of the capacitor body, and a fifth surface and a sixth surface connected to the first surface, the second surface, the third surface and the fourth surface, the fifth and sixth surfaces opposing each other in a width direction of the capacitor body, the first internal electrodes being exposed through the third surface and the fourth surface and the second internal electrodes being exposed through the fifth surface and the sixth surface;

the multilayer capacitor further comprises:
a second external electrode disposed on the fourth surface of the capacitor body and connected to exposed portions of the first internal electrodes;
a third external electrode and a fourth external electrode disposed on the fifth surface and the sixth surface of the capacitor body, respectively, the third external electrode and the fourth external electrode connected to exposed portions of the second internal electrodes;
a second insulating layer disposed on the fifth surface and overlapping a portion of the second external electrode and another portion of the third external electrode in the width direction;
a third insulating layer disposed on the sixth surface and overlapping another portion of the first external electrode and a portion of the fourth external electrode in the width direction;
a fourth insulating layer disposed on the sixth surface and overlapping another portion of the second external electrode and another portion of the fourth external in the width direction; and
a second conductive resin layer, a third conductive resin layer and a fourth conductive resin layer disposed on the second external electrode, the third external electrode and the fourth external electrode, respectively, and
the one surface is the third surface, and the another surface is the fifth surface.

3. The multilayer capacitor of claim 2, wherein a portion of each of the second internal electrodes exposed through the fifth surface and the sixth surface of the capacitor body is in direct contact with at least one of the first to fourth insulating layers.

4. The multilayer capacitor of claim 2, wherein the first conductive resin layer, the second conductive resin layer, the third conductive resin layer and the fourth conductive resin layer are respectively disposed between adjacent insulating layers among the first to fourth insulating layers.

5. The multilayer capacitor of claim 2, wherein each of the second internal electrodes includes:
a body portion spaced apart from an edge of the capacitor body; and
a first lead portion and a second lead portion extending from the body portion and exposed through the fifth surface and the sixth surface of the capacitor body, respectively.

6. The multilayer capacitor of claim 2, wherein the first external electrode and the second external electrode extend from the third surface and the fourth surface of the capacitor body, respectively, to portions of the first surface and the second surface and portions of the fifth surface and the sixth surface.

7. The multilayer capacitor of claim 2, wherein the third external electrode and the fourth external electrode extend from the fifth surface and the sixth surface of the capacitor body, respectively, to portions of the first surface and the second surface.

8. The multilayer capacitor of claim 2, further comprising a first plating layer, a second plating layer, a third plating layer and a fourth plating layer disposed on the first conductive resin layer, second conductive resin layer, third conductive resin layer and fourth conductive resin layer, respectively.

9. The multilayer capacitor of claim 2, wherein each of the first internal electrodes further includes a third lead portion and a fourth lead portion, the third lead portion being exposed through the third surface and portions of the fifth surface and the sixth surface of the capacitor body, and the fourth lead portion being exposed through the fourth surface and portions of the fifth surface and the sixth surface of the capacitor body.

10. The multilayer capacitor of claim 9, wherein portions of the third lead portion and the fourth lead portion exposed through the fifth surface and the sixth surface of the capacitor body are in direct contact with at least one of the first to fourth insulating layers.

11. A board having a multilayer capacitor mounted thereon, the board comprising:
   a substrate having a plurality of electrode pads spaced apart from each other; and
   the multilayer capacitor of claim 1 mounted on the substrate as the first external electrode is connected to one of the electrode pads.

* * * * *